(12) United States Patent
Motz

(10) Patent No.: US 8,072,208 B2
(45) Date of Patent: Dec. 6, 2011

(54) INTEGRATED CIRCUIT WITH TRACKING LOGIC

(75) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 826 days.

(21) Appl. No.: 12/130,262

(22) Filed: May 30, 2008

(65) Prior Publication Data

US 2009/0295373 A1 Dec. 3, 2009

(51) Int. Cl.
*G01R 35/00* (2006.01)
(52) U.S. Cl. ......................................... 324/202; 702/104
(58) Field of Classification Search .................. 324/202, 324/249; 702/104
See application file for complete search history.

(56) References Cited

U.S. PATENT DOCUMENTS

| 6,279,375 | B1 | 8/2001 | Draxelmayr |
| 6,297,627 | B1 | 10/2001 | Towne et al. |
| 6,525,531 | B2 | 2/2003 | Forrest et al. |
| 2003/0225539 | A1 | 12/2003 | Motz et al. |

OTHER PUBLICATIONS

Motz et al., A Chopped Hall Sensor With Small Jitter and Programmable "True Power-On" Function, Journal of Solid-State Circuits, vol. 40, No. 7, Jul. 2005, pp. 1533-1540.
Draxelmayr et al., A Self-Calibrating Hall Sensor IC With Direction Detection, Journal of Solid-State Circuits, vol. 38, No. 7, Jul. 2003, pp. 1207-1212.
Makinwa et al., Smart Sensor Design: The Art of Compensation and Cancellation, IEEE, 2007, pp. 76-82.

*Primary Examiner* — Bot Ledynh
(74) *Attorney, Agent, or Firm* — Dicke, Billig & Czaja, PLLC

(57) ABSTRACT

An integrated circuit including an amplifier and a first circuit. The amplifier is configured to receive a sensed signal and provide an amplified signal. The first circuit is configured to track a first signal that is based on the amplified signal. The first circuit includes a first comparator, tracking logic and a first digital to analog converter. The first comparator is configured to respond to a second signal that is based on the first signal and provide a comparator output signal. The tracking logic is configured to receive the comparator output signal and update a digital output. The first digital to analog converter is configured to receive the digital output and provide a tracking signal that is summed with the first signal to provide the second signal.

22 Claims, 4 Drawing Sheets

INTEGRATED CIRCUIT WITH TRACKING LOGIC

BACKGROUND

Sensors are employed in a wide range of technological applications including automotive, industrial and consumer applications. These applications need sensors that operate reliably according to specified performance characteristics. For this reason, sensors are calibrated to offset deviations in sensor performance and to ensure that measurements are performed accurately. The sensor industry has developed self-calibrating sensors to reduce calibration time and cost. Self-calibrating sensors include some Hall effect sensors, magneto-resistive sensors and other suitable sensors.

Usually, in Hall effect sensors, a constant current is provided to a Hall element or plate and a magnetic field is applied perpendicular to the current flowing through the Hall plate. Charge carriers in the Hall plate are deflected due to the Lorentz force to create a Hall voltage that is perpendicular to both the magnetic field and the current flow. This Hall voltage can be measured and is directly proportional to the magnetic field. Hall effect sensors are used for speed, rotational speed, linear position, linear angle and position measurements in automotive, industrial and consumer applications.

Magneto-resistive (XMR) sensors, typically, include a supporting magnet and one or more XMR sensor elements for measuring a magnetic field. The supporting magnet and the XMR sensor elements are in a fixed position relative to each other. The XMR sensor elements do not usually operate in their saturation range and the supporting magnet provides a back bias magnetic field that is superimposed on the XMR sensor elements to stabilize the transfer characteristic of the XMR sensor elements. As the position of a detected object changes relative to the source of the magnetic field, the magnetic field produces a proportional voltage signal in the XMR sensor elements. Suitable XMR sensor elements include anisotropic magneto-resistive (AMR) sensor elements, giant magneto-resistive (GMR) sensor elements, tunneling magneto-resistive (TMR) sensor elements, and colossal magneto-resistive (CMR) sensor elements. XMR sensors can be used as proximity sensors, motion sensors, position sensors, or speed sensors.

Typically, self-calibrating sensors with switching outputs are self-adjusted to a switching point. Minimum and maximum values of the incoming signal are obtained and the switching point is calculated from them. For example, the optimum switching point may be exactly half-way between the maximum and minimum values. Usually, a fast regulation or tracking loop follows the incoming signal to determine an offset signal, which is summed with the incoming signal to adjust the incoming signal to the switching point. In the adjusted condition, the offset signal is a DC signal that is overlaid on the incoming signal. A main comparator receives the incoming signal or a signal based on the incoming signal and provides an output that switches from one state to another.

The resolution of the tracking loop must be high enough to track the incoming signal and provide the offset signal. Also, sometimes the tracking loop circuitry cannot follow offset jumps in the incoming signal, where the offset jumps may be caused by external disturbances or the changing of a sensor air-gap. In addition, the tracking loop often includes circuitry that introduces errors into the incoming signal, such as amplifiers that introduce offset error, gain error and noise, and comparators that introduce offset error.

For these and other reasons there is a need for the present invention.

SUMMARY

One embodiment described in the disclosure provides an integrated circuit including an amplifier and a first circuit. The amplifier is configured to receive a sensed signal and provide an amplified signal. The first circuit is configured to track a first signal that is based on the amplified signal. The first circuit includes a first comparator, tracking logic and a first digital to analog converter. The first comparator is configured to respond to a second signal that is based on the first signal and provide a comparator output signal. The tracking logic is configured to receive the comparator output signal and update a digital output. The first digital to analog converter is configured to receive the digital output and provide a tracking signal that is summed with the first signal to provide the second signal.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
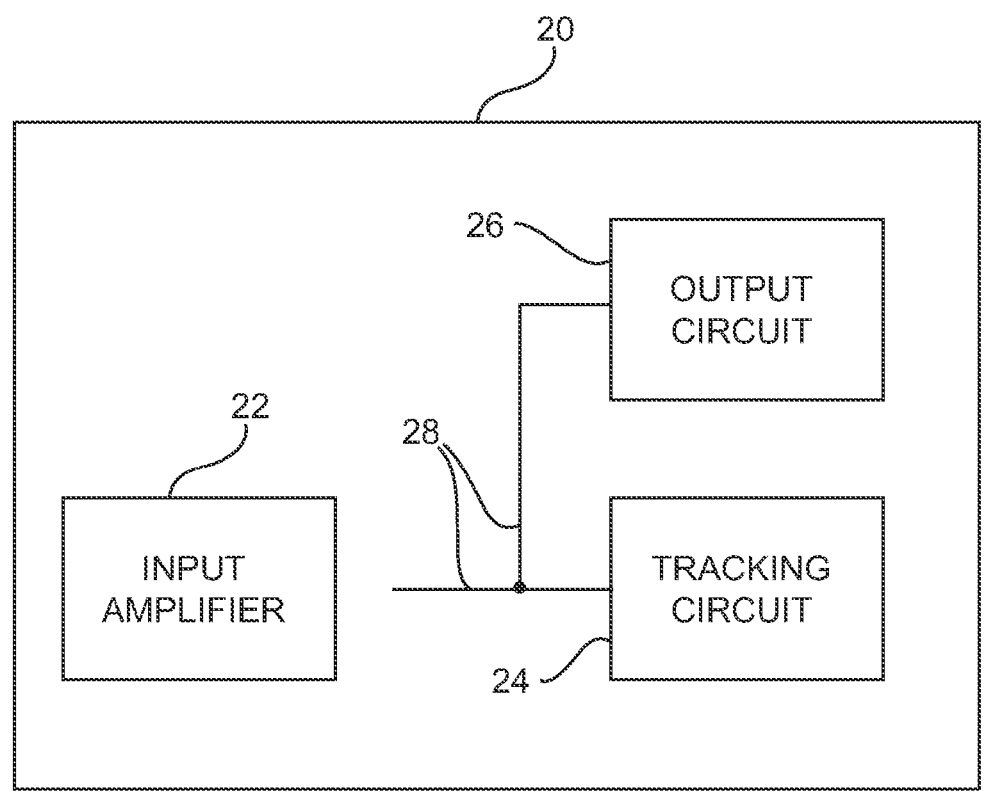
FIG. 1 is a diagram illustrating one embodiment of a self-calibrating sensor system.

FIG. 1 is a diagram illustrating one embodiment of a self-calibrating sensor system 20. Sensor 20 includes an input amplifier 22, a tracking circuit 24 and an output circuit 26.

Tracking circuit 24 is electrically coupled to output circuit 26 via input signal path 28. In one embodiment, sensor 20 is an integrated circuit chip.

Input amplifier 22 receives sensed signals from one or more sensor elements and provides an amplified signal that is based on the received sensed signals. In one embodiment, sensor 20 is an integrated circuit chip that includes one or more sensor elements that provide the sensed signals. In one embodiment, sensor 20 is an integrated circuit chip that receives the sensed signals from one or more sensor elements that are not part of the integrated circuit chip. In one embodiment, the one or more sensor elements are Hall effect sensor elements. In one embodiment, the one or more sensor elements are XMR sensor elements.

Tracking circuit 24 and output circuit 26 receive an input signal that is based on the amplified signal from input amplifier 22 via input signal path 28. An offset signal is summed with the amplified signal to provide the input signal. In one embodiment, an offset signal is summed with the amplified signal and the summation is low pass filtered to provide the input signal.

Tracking circuit 24 receives the input signal and tracks the input signal in a tracking loop or path. Tracking circuit 24 provides a tracking signal that is summed with the input signal to follow the input signal via the tracking loop. Tracking circuit also provides a dithering signal that is summed with the input signal to increase the resolution of the tracking loop. In one embodiment, the tracking signal is provided via at least 11 bits of resolution in the tracking loop. In one embodiment, the tracking signal is provided via at least 12 bits of resolution in the tracking loop. In one embodiment, the dithering signal increases the resolution of the tracking loop at least 3 bits.

Tracking circuit 24 provides a comparator output signal based on a comparator input signal that includes the summation of the input signal, the tracking signal and the dithering signal. Tracking circuit 24 provides a digital output based on the comparator output signal, where the digital output is used to provide the tracking signal. Tracking circuit 24 also calculates a digital offset update signal that is used to provide the offset signal, which is summed with the amplified signal to provide the input signal. The amplified signal is offset adjusted to provide the input signal. In one embodiment, the amplified signal is offset adjusted to provide the input signal such that the input signal varies about the switching point of an output circuit, such as output circuit 26.

The tracking loop is a fast regulation loop that follows the input signal to determine the fast tracking signal and the slower offset signal. In one embodiment, the slower offset signal is summed with the amplified signal to adjust the input signal to the switching point of output circuit 26. In one embodiment, in the adjusted condition, the offset signal is a DC offset signal overlaid on the amplified signal.

Output circuit 26 receives the input signal and provides a high state or a low state output signal based on the input signal. In one embodiment, output circuit 26 includes circuitry for outputting a current that switches between a high current value and a low current value. In one embodiment, output circuit 26 includes circuitry for outputting a voltage that switches between a high voltage value and a low voltage value.

Output circuit 26 includes a main comparator that receives the input signal and provides a high state or a low state based on the input signal. The main comparator is an offset-compensated continuous-time comparator that provides a continuous output signal. In one embodiment, the main comparator is a chopping comparator. In one embodiment, the main comparator is a ping-pong comparator, where the output signal is provided by switching between two comparators. In one embodiment, the main comparator is a chopping comparator with auto-zeroing. In one embodiment, the main comparator is a ping-pong comparator with auto-zeroing.

Sensor 20 provides a high resolution tracking loop to track the input signal and provide the slower offset signal. Tracking circuit 24 provides a fast tracking signal in the tracking loop to follow offset jumps in the input signal. Also, tracking circuit 24 does not include circuitry, such as amplifiers and comparators that introduce errors in the input signal and, ultimately, the output signal.

Figure 2:
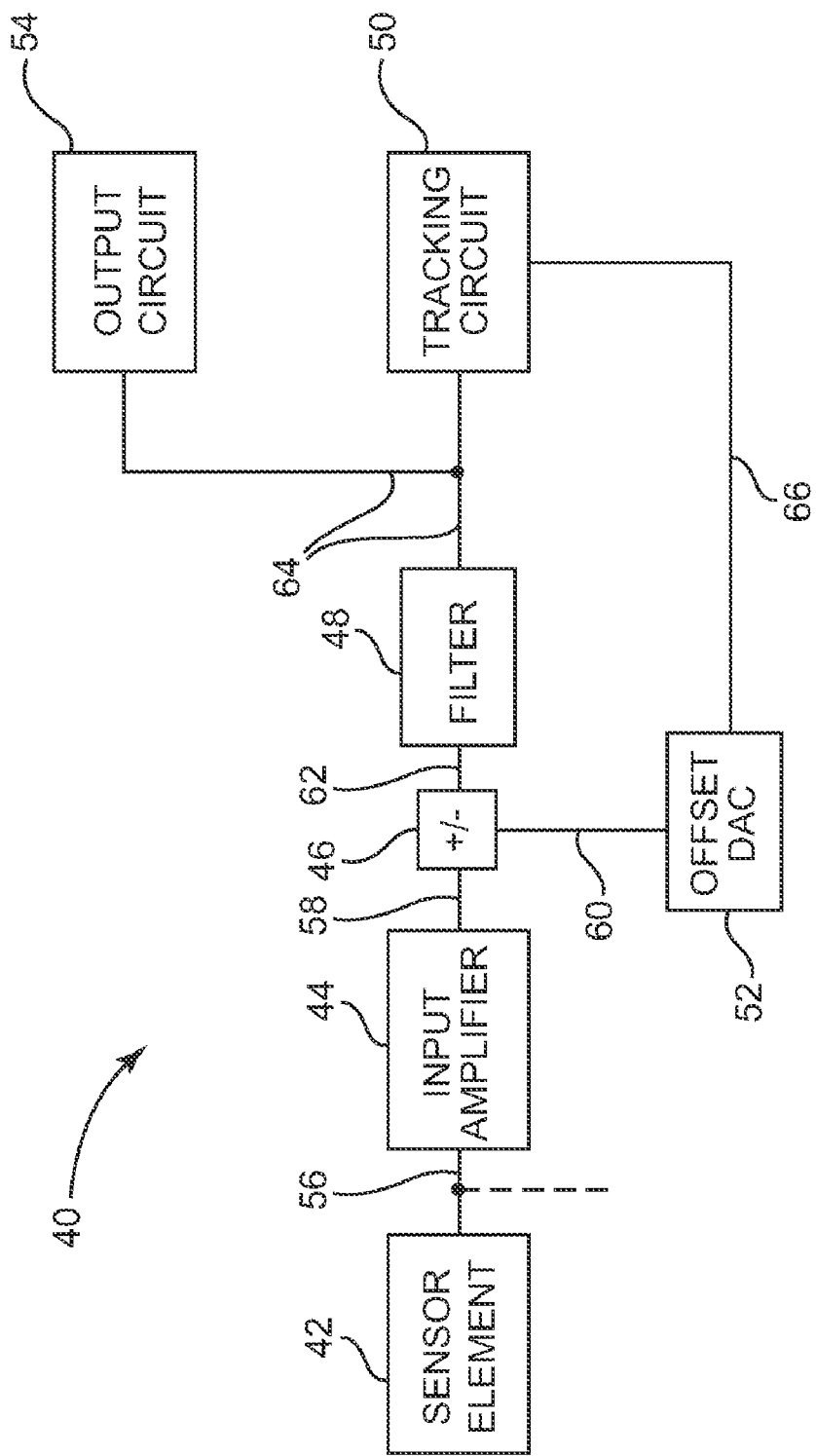
FIG. 2 is a diagram illustrating one embodiment of a self-calibrating sensor system that adjusts an offset signal to provide an output signal.

FIG. 2 is a diagram illustrating one embodiment of a self-calibrating sensor system 40 that adjusts an offset signal to provide an output signal. Sensor 40 includes one or more sensor elements, such as sensor element 42, an input amplifier 44, a summing circuit 46, a filter 48, a tracking circuit 50, an offset digital-to-analog converter (DAC) 52, and an output circuit 54. Input amplifier 44 is similar to input amplifier 22 (shown in FIG. 1). Tracking circuit 50 is similar to tracking circuit 24, and output circuit 54 is similar to output circuit 26. In one embodiment, sensor 40 is an integrated circuit chip.

Sensor element 42 is electrically coupled to input amplifier 44 via sensor input path 56, and input amplifier 44 receives sensed signals at 56 from sensor element 42 via sensor input path 56. In one embodiment, the one or more sensor elements, such as sensor element 42, are Hall effect sensor elements. In one embodiment, the one or more sensor elements, such as sensor element 42, are XMR sensor elements.

Input amplifier 44 is electrically coupled to summing circuit 46 via first summing input path 58 and input amplifier 44 provides an amplified signal at 58 that is based on the received sensed signals at 56. In one embodiment, input amplifier 44 is a differential amplifier that receives sensed signals at 56. In one embodiment, input amplifier 44 provides a single ended amplified signal at 58. In one embodiment, input amplifier 44 provides differential amplified signals at 58.

Summing circuit 46 is electrically coupled to offset DAC 52 via second summing input path 60 and to filter 48 via filter input path 62. Summing circuit 46 receives the amplified signal at 58 from input amplifier 44 via first summing input path 58 and the offset signal at 60 from offset DAC 52 via second summing input path 60. Summing circuit 46 sums the amplified signal at 58 and the offset signal at 60 to provide an offset adjusted signal at 62. In one embodiment, summing circuit 46 is situated between sensor element 40 and input amplifier 44, where summing circuit 46 receives and sums the sensed signals at 56 from sensor element 42 and the offset signal from offset DAC 52. In one embodiment, summing circuit 46 is part of input amplifier 44. In one embodiment, summing circuit 46 provides a single ended offset adjusted signal at 62. In one embodiment, summing circuit 46 provides a differential offset adjusted signal at 62.

Filter 48 is electrically coupled to tracking circuit 50 and output circuit 54 via input signal path 64. Filter 48 receives the offset adjusted signal at 62 via filter input path 62 and filters the offset adjusted signal at 62 to provide an input signal at 64. In one embodiment, filter 48 is a low-pass filter that filters off high frequency noise in the offset adjusted signal at 62. In one embodiment, sensor 40 does not include filter 48 and the offset adjusted signal at 62 is the input signal at 64. In one embodiment, filter 48 provides a single ended input signal at 64. In one embodiment, filter 48 provides a differential input signal at 64.

Tracking circuit 50 and output circuit 54 receive the input signal at 64 via input signal path 64. Tracking circuit 50 is electrically coupled to offset DAC 52 via offset update path

66. In one embodiment, the input signal at 64 is a single ended input signal. In one embodiment, the input signal at 64 is a differential input signal.

Tracking circuit 50 receives the input signal at 64 and tracks the input signal at 64 in a tracking loop, where a tracking signal is summed with the input signal at 64 to follow or track the input signal at 64 and a dithering signal is summed with the input signal at 64 to increase the resolution of the tracking loop. Tracking circuit 50 provides a comparator output signal that is based on a comparator input signal including the summation of the input signal, the tracking signal and the dithering signal. Based on the comparator output signal, tracking circuit 50 provides a digital output that is used to provide the tracking signal and tracking circuit 50 calculates a digital updated offset signal at 66 that is used to provide the offset signal at 60.

Offset DAC 52 receives the updated offset signal at 66 via offset update path 66 and provides the offset signal at 60. Summation circuit 46 receives the offset signal at 60 and sums the offset signal at 60 and the amplified signal at 58 to provide the offset adjusted signal at 62. Filter 48 receives the offset adjusted signal at 62 and provides the input signal at 64. The amplified signal at 58 is offset adjusted and filtered to provide the input signal at 64 such that the input signal at 64 varies about the switching point of output circuit 54. In one embodiment, in the adjusted condition, the offset signal at 60 is a DC offset signal overlaid on the amplified signal at 58.

Output circuit 54 receives the input signal at 64 and provides a high state or a low state output signal based on the input signal at 64, which varies about the switching point of output circuit 54. In one embodiment, output circuit 54 includes circuitry for outputting a current that switches between a high current value and a low current value. In one embodiment, output circuit 54 includes circuitry for outputting a voltage that switches between a high voltage value and a low voltage value.

Figure 3:
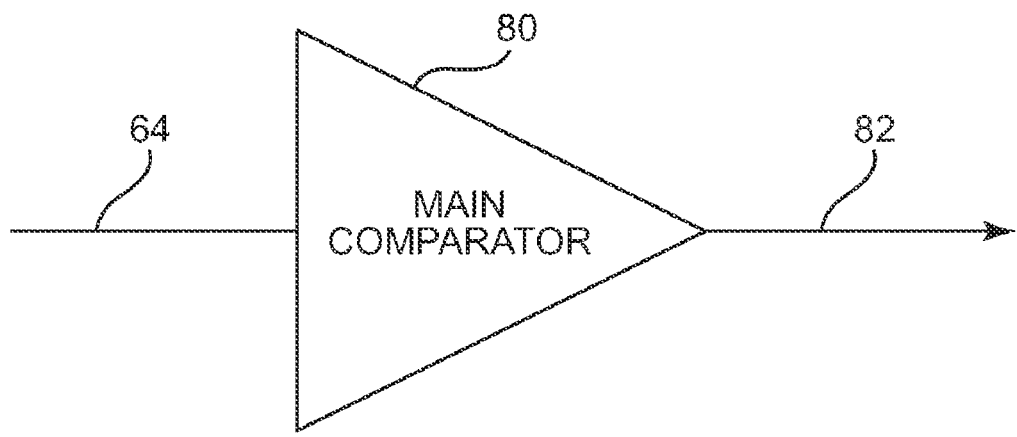
FIG. 3 is a diagram illustrating one embodiment of a main comparator.

FIG. 3 is a diagram illustrating one embodiment of a main comparator 80 in output circuit 54. Main comparator 80 is an offset-compensated continuous-time comparator that provides a continuous output signal via output path 82. Main comparator 80 receives the input signal via input signal path 64 and provides the output signal at 82. Main comparator 80 provides a continuous output signal at 82 that switches between a high state and a low state based on the input signal at 64.

Regulation errors, such as phase errors and duty-cycle errors in the output signal at 82, are avoided through auto-zeroing or chopped operation of main comparator 54. Also, main comparator 80 is outside the tracking loop in tracking circuit 50, such that main comparator 80 switches the output signal at 82 independently of clocking signals in tracking circuit 50. This reduces phase errors and temporal jittering in the output signal at 82.

In one embodiment, main comparator 80 is a chopping comparator. In one embodiment, main comparator 80 is a ping-pong comparator including two comparators that alternate between a normal mode and an auto-zeroing mode, where the output signal at 82 is provided by switching to the comparator in normal mode and away from the comparator in auto-zeroing mode. In one embodiment, main comparator 80 is a chopping comparator with auto-zeroing. In one embodiment, main comparator 80 is a ping-pong comparator with auto-zeroing.

Figure 4:
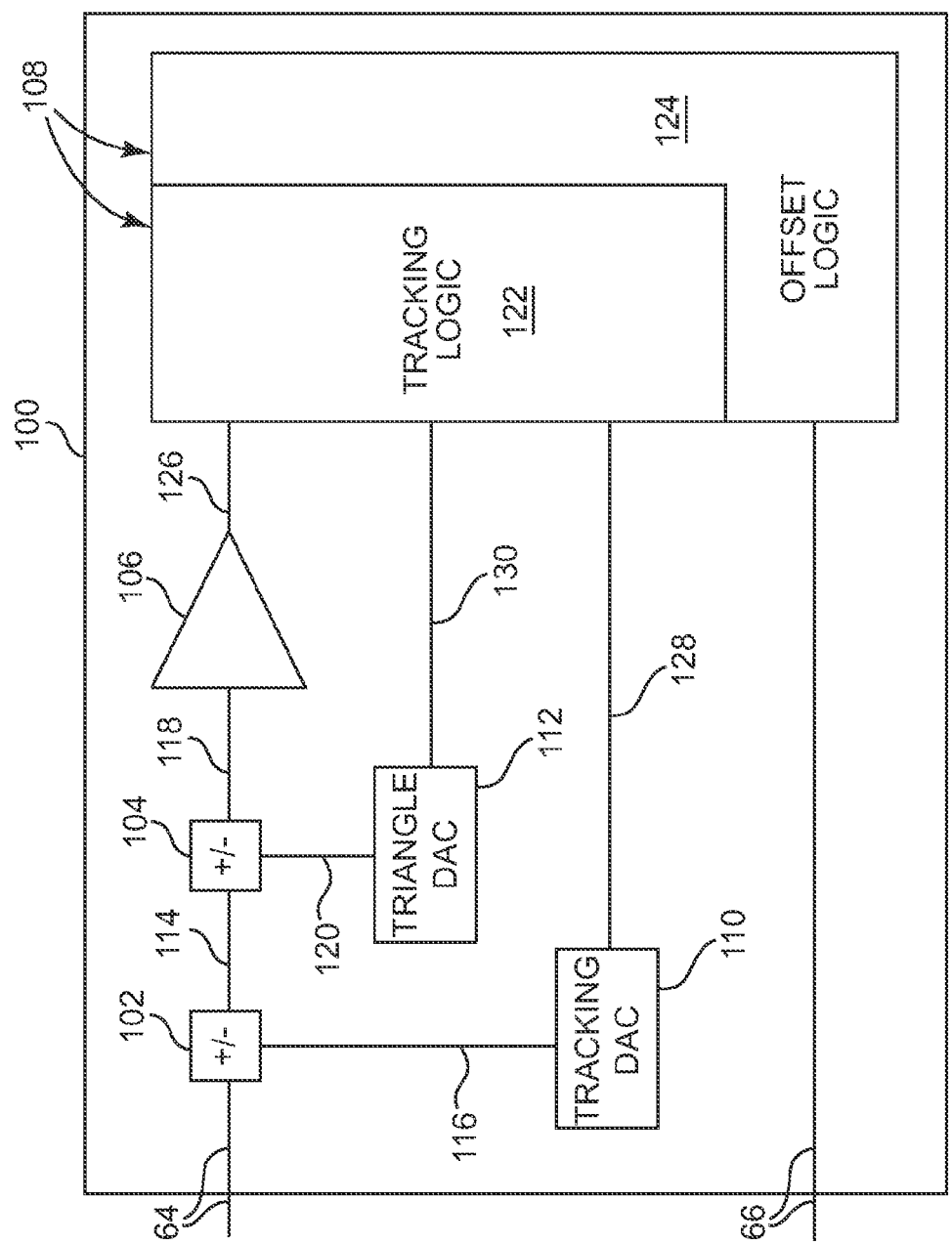
FIG. 4 is a diagram illustrating one embodiment of a tracking circuit that tracks an input signal.

FIG. 4 is a diagram illustrating one embodiment of a tracking circuit 100 that tracks an input signal. Tracking circuit 100 receives the input signal and tracks the input signal in a tracking loop or path. Tracking circuit 100 sums a tracking signal and a dithering signal with the input signal to track the input signal and increase the resolution of the tracking loop. Tracking circuit 100 is similar to tracking circuit 50 (shown in FIG. 2).

Tracking circuit 100 includes a first summing circuit 102, a second summing circuit 104, a tracking comparator 106, logic 108, a tracking DAC 110 and a triangle DAC 112. First summing circuit 102 is electrically coupled to second summing circuit via summing circuit path 114 and to tracking DAC 110 via tracking signal path 116. Second summing circuit 104 is electrically coupled to tracking comparator 106 via comparator input signal path 118 and to triangle DAC 112 via dithering signal path 120.

Logic includes tracking logic 122 and offset logic 124. Tracking comparator 106 is electrically coupled to tracking logic 122 via comparator output path 126 and tracking logic 122 is electrically coupled to tracking DAC 110 via digital tracking signal path 128 and to triangle DAC 112 via digital control signal path 130. Offset logic is electrically coupled to offset DAC 52 (shown in FIG. 2) via offset update path 66. Tracking logic 122 and offset logic 124 are electrically coupled together and offset logic 124 provides an updated offset signal via offset update path 66.

First summing circuit 102 receives the input signal via input signal path 64 and the tracking signal via tracking signal path 116, and sums the input signal at 64 and the tracking signal at 116 to provide a summation of the input signal and the tracking signal at 114. Second summing circuit 104 receives the summation of the input signal and the tracking signal via summing circuit path 114 and the dithering signal via dithering signal path 120. Second summing circuit 104 sums the summation of the input signal and the tracking signal at 114 with the dithering signal at 120 to provide a comparator input signal at 118.

Tracking comparator 106 receives the comparator input signal at 118, which is the summation of the input signal, the tracking signal, and the dithering signal and provides a comparator output signal at 126. Tracking comparator 106 is an offset-adjusted tracking comparator. In one embodiment, tracking comparator 106 is an auto-zeroing comparator. In one embodiment, tracking comparator 106 is an auto-zeroing comparator operating at 1.4 mega-hertz. In one embodiment, tracking comparator 106 is a chopped comparator. In one embodiment, tracking comparator 106 is a ping-pong comparator.

Tracking logic 122 receives the comparator output signal at 126 and provides a digital value that represents the summation of the input signal, the tracking signal, and the dithering signal. In one embodiment, tracking logic 122 includes an up/down counter that counts up at one transition of the comparator output signal at 126 and down at the other transition of the comparator output signal at 126 to provide a counter value that represents the summation of the input signal, the tracking signal, and the dithering signal.

Tracking logic 122 provides a digital output to tracking DAC 110 via digital tracking signal path 128. The digital output corresponds to the digital value that represents the summation of the input signal, the tracking signal, and the dithering signal. In one embodiment, the digital output is the digital value that represents the summation of the input signal, the tracking signal, and the dithering signal.

Tracking DAC 110 receives the digital output at 128 and provides the tracking signal at 116. In one embodiment, tracking DAC 110 is an 11 bit DAC that provides 11 bits of resolution in the tracking loop. In one embodiment, tracking DAC 110 is a 12 bit DAC that provides 12 bits of resolution in the tracking loop. In other embodiments, tracking DAC 110 is at least an 11 bit DAC that provides at least 11 bits of resolution in the tracking loop.

First summing circuit 102 receives the tracking signal at 116 and sums the tracking signal at 116 with the input signal at 64 to provide the summation of the tracking signal and the input signal at 114. In one embodiment, first summing circuit 102 is situated in tracking comparator 106. In one embodiment, an additional filter is provided to filter the input signal at 64 and first summing circuit 102 is situated in the additional filter.

Tracking logic 122 provides a digital control signal to triangle DAC 112 via digital control signal path 130 and triangle DAC 112 provides a triangular shaped dithering signal at 120. In one embodiment, triangle DAC 112 provides 3 bits of resolution in the tracking loop. In one embodiment, triangle DAC 112 provides at least 3 bits of resolution in the tracking loop. In other embodiments, DAC 112 is configured to provide another type of dithering signal, such as a saw tooth waveform.

In one embodiment, tracking DAC 110 is an 11 bit DAC that provides 11 bits of resolution and triangle DAC 112 provides 3 bits of resolution, such that the tracking loop has 14 bits of resolution. In one embodiment, tracking DAC 110 is a 12 bit DAC that provides 12 bits of resolution and triangle DAC 112 provides 3 bits of resolution, such that the tracking loop has 15 bits of resolution. In other embodiments, tracking DAC 110 is at least an 11 bit DAC that provides at least 11 bits of resolution and triangle DAC 112 provides at least 3 bits of resolution, such that the tracking loop has at least 14 bits of resolution.

Second summing circuit 104 receives the dithering signal at 120 and sums the dithering signal at 120 with the summation of the input signal and the tracking signal at 114. Second summing circuit 104 provides the comparator input signal at 118 and tracking logic 122 receives the comparator output signal at 126. Tracking logic 122 includes a tracking algorithm that sums integral multiples of the dithering signal, such that the mean value of the dithering signal in the tracking logic is zero.

Offset logic 124 receives digital values that represent the summation of the input signal, the tracking signal, and the dithering signal from tracking logic 122 and calculates an updated offset signal. Offset logic 124 provides the updated offset signal to offset DAC 52 via offset update path 66.

Tracking circuit 100 provides a high resolution tracking loop that tracks the input signal at 64. Tracking circuit 100 provides a fast tracking signal at 116, in the tracking loop, that tracks offset jumps in the input signal at 64. Tracking circuit 100 provides the slower updated offset signals at 66 and offset errors in the sensed signals, input amplifier 44 and offset DAC 52 are compensated for via the tracking loop. In addition, tracking circuit 100 does not include circuitry, such as amplifiers and comparators that introduce errors in the input signal at 64 and, ultimately, the output signal at 82.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
an amplifier configured to receive a sensed signal and provide an amplified signal;
a first circuit configured to track a first signal that is based on the amplified signal, wherein the first circuit comprises:
a first comparator configured to respond to a second signal that is based on the first signal and provide a comparator output signal;
tracking logic configured to receive the comparator output signal and update a digital output; and
a first digital to analog converter configured to receive the digital output and provide a tracking signal that is summed with the first signal to provide the second signal.

2. The integrated circuit of claim 1, wherein the first circuit comprises:
a second digital to analog converter configured to provide a dithering signal that is summed with the first signal to provide the second signal.

3. The integrated circuit of claim 2, wherein the first digital to analog converter provides at least 11 bits of resolution and the second digital to analog converter increases the resolution by at least 3 bits.

4. The integrated circuit of claim 2, wherein the tracking logic integrates the dithering signal such that the mean value of the dithering signal in the digital output is substantially zero.

5. The integrated circuit of claim 2, wherein the dithering signal is a triangular dithering signal.

6. The integrated circuit of claim 1, wherein the first comparator is an auto-zeroing comparator.

7. The integrated circuit of claim 1, comprising:
a second comparator configured to receive the first signal and provide an output signal, wherein the second comparator is an offset-compensated continuous-time comparator.

8. The integrated circuit of claim 1, comprising:
a second digital to analog converter configured to provide an offset signal that is summed with the amplified signal to provide an offset adjusted amplified signal.

9. The integrated circuit of claim 8, comprising:
a low pass filter configured to filter the offset adjusted amplified signal and provide the first signal.

10. A system comprising:
a first circuit configured to track a first signal via a tracking path, comprising:
a comparator configured to respond to a second signal that is based on the first signal and provide a comparator output signal;
tracking logic configured to receive the comparator output signal and provide a digital output;
a first digital to analog converter configured to receive the digital output and provide a tracking signal that is summed with the first signal to provide the second signal; and
a second digital to analog converter configured to provide a dithering signal that is summed with the first signal to provide the second signal and enhance resolution of the tracking path.

11. The system of claim 10, wherein the second digital to analog converter enhances the resolution of the tracking path at least 3 bits.

12. The system of claim 10, wherein the tracking logic integrates the dithering signal such that the mean value of the dithering signal in the digital output is substantially zero.

13. An integrated circuit comprising:
means for receiving a sensed signal and providing an amplified signal;
means for tracking a first signal that is based on the amplified signal, comprising:
  means for responding to a second signal that is based on the first signal to provide a comparator output signal;
  means for receiving the comparator output signal and updating a digital output; and
  means for receiving the digital output and providing a tracking signal that is summed with the first signal to provide the second signal.

14. The integrated circuit of claim 13, wherein the means for tracking comprises:
means for providing a dithering signal that is summed with the first signal to provide the second signal.

15. The integrated circuit of claim 13, comprising:
means for receiving the first signal and providing a continuous-time output signal.

16. A method of self-calibrating a sensor, comprising:
providing an amplified signal based on a sensed signal;
tracking a first signal that is based on the amplified signal, comprising:
  comparing a second signal that is based on the first signal to provide a comparator output signal;
  updating a digital output via the comparator output signal;
  providing a tracking signal via the digital output; and
  summing the tracking signal and the first signal to provide the second signal.

17. The method of claim 16, wherein tracking comprises:
providing a dithering signal; and
summing the dithering signal and the tracking signal and the first signal to provide the second signal.

18. The method of claim 17, comprising:
integrating the dithering signal such that the mean value of the dithering signal in the digital output is substantially zero.

19. The method of claim 16, comprising:
receiving the first signal; and
providing a continuous-time output signal.

20. The method of claim 16, comprising:
providing an offset signal that is summed with the amplified signal to provide an offset adjusted amplified signal; and
filtering the offset adjusted amplified signal to provide the first signal.

21. A method of self-calibrating a sensor, comprising:
tracking a first signal, comprising:
  comparing a second signal that is based on the first signal to provide a comparator output signal;
  updating a digital output via the comparator output signal;
  providing a tracking signal via the digital output;
  providing a dithering signal; and
  summing the tracking signal and the dithering signal and the first signal to provide the second signal.

22. The method of claim 21, comprising:
providing an amplified signal based on a sensed signal;
receiving the first signal, which is based on the amplified signal; and
providing a continuous-time output signal.

* * * * *